(12) United States Patent
Concil et al.

(10) Patent No.: US 7,552,379 B2
(45) Date of Patent: Jun. 23, 2009

(54) METHOD FOR ITERATIVE DECODING EMPLOYING A LOOK-UP TABLE

(75) Inventors: Andrea Concil, Novara (IT); Andrea Giorgi, Busto Arsizio (IT); Stefano Valle, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 539 days.

(21) Appl. No.: 11/324,100

(22) Filed: Dec. 29, 2005

(65) Prior Publication Data
US 2007/0157066 A1 Jul. 5, 2007

(51) Int. Cl.
H03M 13/03 (2006.01)
(52) U.S. Cl. .................. 714/794; 375/262; 375/341
(58) Field of Classification Search .......... 714/752, 714/794–796; 375/262, 341
See application file for complete search history.

(56) References Cited

U.S. PATENT DOCUMENTS

| 6,298,463 | B1 | 10/2001 | Bingeman et al. | |
|---|---|---|---|---|
| 7,246,295 | B2* | 7/2007 | Xu | 714/755 |
| 2003/0056167 | A1* | 3/2003 | Yuan et al. | 714/759 |
| 2003/0091129 | A1* | 5/2003 | Zhang et al. | 375/340 |
| 2005/0052991 | A1* | 3/2005 | Kadous | 370/216 |

OTHER PUBLICATIONS

Bahl, L.R. et al., "Optimal Decoding of Linear Codes for Minimizing Symbol Error Rate," IEEE Transactions on Information Theory, Mar. 1974, pp. 284-287.

Berrou, C. et al., "Near Shannon Limit Error-Correcting Coding and Decoding: Turbo-Codes (1)," IEEE International Conference on Communications, Geneva, Switzerland, 1993, pp. 1064-1070.

Gallager, R.G., "Low-Density Parity-Check Codes," IRE Transactions on Information Theory, Jan. 1962, pp. 21-28.

Hagenauer, J. et al., "Iterative Decoding of Binary Block and Convolutional Codes," IEEE Transactions on Information Theory, vol. 42, No. 2, Mar. 1996, pp. 429-445.

Hu, X. et al., "Efficient Implementations of the Sum-Product Algorithm for Decoding LDPC Codes," In Proc. IEEE Globecom, 2001, pp. 1036-1036E.

Robertson, P. et al., "A Comparison of Optimal and Sub-Optimal MAP Decoding Algorithms Operating in the Log Domain," IEEE International Conference on Communications, Seattle, Washington, Jun. 1995, pp. 1009-1013.

* cited by examiner

*Primary Examiner*—Esaw T Abraham
(74) *Attorney, Agent, or Firm*—Lisa K. Jorgenson; Robert Iannucci; Seed IP Law Group PLLC

(57) ABSTRACT

A method performs iterative decoding of information coded by an error correction code. The method includes: defining a transcendent first function representing a quantity to be evaluated for the decoding method; defining a quantized second function approximating the first function; computing first values of the second function obtained based on first arguments; the first values being not null and the first arguments being variable in a limited range having a maximum limit; computing second values of the second function obtained on the basis of second arguments, the second values being null; and generating a look-up table representing the first function and containing the first and second values associated to indexes correlated to said first arguments and to an expected maximum limit.

29 Claims, 7 Drawing Sheets

STANDARD APPROACH

METHOD FOR ITERATIVE DECODING EMPLOYING A LOOK-UP TABLE

BACKGROUND OF THE INVENTION

1. Field of the Invention

The present invention relates to the field of error correction codes such as the ones employed for wireline and wireless digital communication systems and in data storage systems. As an example, the present invention relates to iterative decoding methods that implement the Maximum A Posteriori (MAP) Algorithm.

2. Description of the Related Art

A digital communication system of both wireless and wireline type usually comprises a transmitter, a communication channel and a receiver as known by those skilled in the art.

The communication channel of such system is often noisy and introduces errors in the information being transmitted such that the information received at the receiver is different from the information transmitted.

In general, in order to correct an error of the channel transmitted through wireline and wireless environments, the digital communication system uses a protection method by which the transmitter performs a coding operation using an error correction code and the receiver corrects the error produced by the noisy channel.

Various coding schemes have been proposed and developed for performing correction of errors introduced by the channel. In particular, turbo codes (which are Forward Error Correction codes, FEC) are capable of achieving better error performance than conventional codes. Furthermore, turbo codes can achieve exceptionally low error rates in a low signal-to-noise ratio environment.

For this reason, such turbo codes can usefully be employed in wireless communications, for example in the more recent CDMA wireless communication standard.

A detailed description of turbo coding and decoding schemes can be found in "*Near Shannon Limit Error-Correcting Coding and Decoding: Turbo-codes*", Berrou et al., Proc., IEEE Int'l Conf. On communications, Geneva, Switzerland, 1993, pp. 1064-1070. Particularly, turbo codes are the parallel concatenation of two or more recursive systematic convolutional codes separated by interleavers.

As known by those skilled in the art, decoding of turbo codes is often complex and involves a large amount of complex computations. Turbo decoding is typically based on a Maximum A Posteriori (MAP) algorithm which operates by calculating the maximum a posteriori probabilities for the data encoded by each constituent code.

While it has been recognized that the MAP algorithm is the optimal decoding algorithm for turbo codes, it is also recognized that implementation of the MAP decoding algorithm is very difficult in practice because of its computational complexities.

To reduce such complexities, approximations and modifications to the MAP algorithm have been developed. These include a Max-Log-MAP algorithm and a Log-MAP algorithm. The Max-Log-MAP and Log-MAP algorithms are described in detail in "*A Comparison of Optimal and Sub-Optimal MAP Decoding Algorithms Operating in the Log Domain*", Robertson et al., IEEE Int'l Conf. on Communications (Seattle, Wash.), June, 1995.

To reduce the computational complexity of the MAP algorithm, the Max-Log-MAP and Log-MAP algorithms perform the entire decoding operation in the logarithmic domain. In fact, in the log domain, multiplication operations become addition operations, thus simplifying numeric computations involving multiplication.

BRIEF SUMMARY OF THE INVENTION

The object of the present invention is to provide an improved method for performing iterative decoding of information which has been coded in accordance with error correction codes such as, for example, a turbo code.

Particularly the inventive method comprises:
defining a first transcendent function representing a quantity to be evaluated for the decoding method;
defining a second quantized function approximating the first function;
computing first values of the second function obtained on the basis of first arguments; the first values being not null and the first arguments being variable in a limited range having a maximum limit;
computing second values of the second function obtained on the basis of second arguments, the second values being null and the second arguments being external to the range;
generating a look-up table representing the first function and containing the first and second values associated to a plurality of indexes correlated to said first arguments and said maximum limit;
retrieving tabled values from said look-up table on the basis of corresponding indexes for computing said quantity.

In accordance with another object, the present invention relates with a receiving apparatus comprising a decoder for performing in a communication system iterative decoding of information coded by an error correction code, the decoder comprising:
a memory storing a look-up table comprising a plurality of tabled values associated to corresponding indexes, said plurality of tabled values comprising:
a first set of non null values associated to a first set of arguments included in a limited range; and
a second set of null values associated to a second set of arguments external to said limited range;
a processor module for retrieving said tabled values from the look-up table an the basis of said indexes and evaluating a quantity related to a transcendent function.

BRIEF DESCRIPTION OF THE SEVERAL VIEWS OF THE DRAWINGS

The characteristics and the advantages of the present invention will be understood from the following detailed description of exemplary non-limiting embodiments thereof with reference to the annexed Figures, in which.

DETAILED DESCRIPTION OF THE INVENTION

Figure 1:
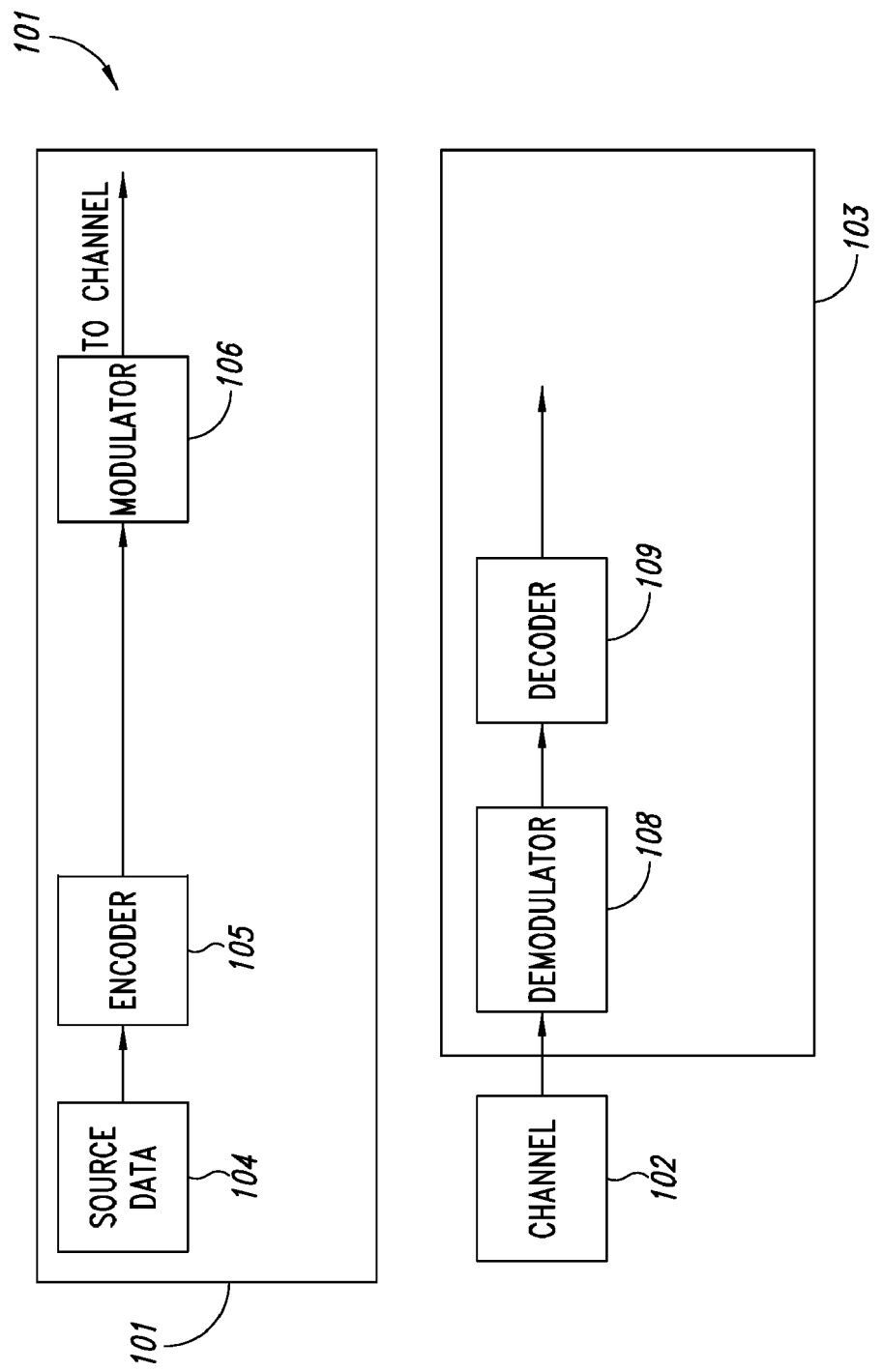
FIG. 1 schematically shows in a block diagram an exemplary digital communication system.

FIG. 1 is a block diagram schematically showing an exemplary digital communication system 100 of both wireless and wireline type. It has to be observed that the present invention is also applicable to data storage systems.

Particularly, the communication system 100 comprises a transmitter 101, a communication channel 102 and a receiver apparatus 103. The transmitter 101 comprises a source 104 of digital data and an encoder 105 to encode data in accordance with error correction codes in order to make the transmission more robust against errors introduced by the channel 102. Furthermore, the transmitter 101 comprises a modulator 106 to translate the encoded bits into signals suitable to be transmitted through the channel 102.

Instead, the receiver apparatus 103 comprises a demodulator 108 for translating the received signals into bit likelihoods or soft values indicating with which probability a received bit is a 0 or 1 logic. Subsequently, such soft values are elaborated by a decoder 109 that retrieves the source bits.

In order to avoid errors introduced by the noisy channel 102, the data bits to be transmitted can be, advantageously, encoded using a PCCC (Parallel Concatenated Convolutional Coding) turbo code known in the art.

Particularly, employing the PCCC turbo code in the digital communication system 100, data bits to be transmitted over the communication channel 102 are encoded as an information sequence (also called systematic information) and two or more parity sequences (also called parity information).

Figure 2:
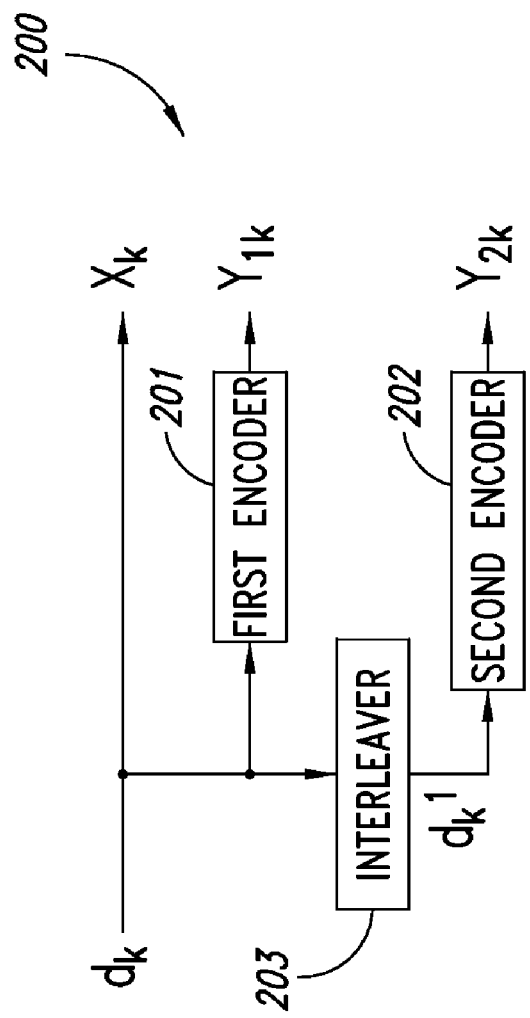
FIG. 2 schematically shows an exemplary encoder for a PCCC turbo code comprised in the communication system of FIG. 1.

FIG. 2 shows schematically an example of a PCCC turbo encoder 200 which can be comprised in the transmitter 101 of the communication system 100.

Particularly, such encoder 200 comprises a first 201 and a second 202 encoder, for example, substantially equal each other. The encoders 201 and 202 are chosen among the recursive systematic convolutional codes (RSC) and are described in "*Near Shannon Limit Error-Correcting Coding and Decoding: Turbo-codes*", Berrou et al., Proc., IEEE Int'l Conf. On communications, Geneva, Switzerland, 1993, pp. 1064-1070 and in U.S. Pat. No. 6,298,463 B1 (Bingeman et al.), herein incorporated by reference.

With reference to a first information bit sequence $d_k$ which corresponds to the data to be transmitted, the PCCC encoder 200 generates a systematic sequence of bits $X_k$, a first parity sequence $Y_{1k}$ and a second parity sequence $Y_{2k}$.

As shown in FIG. 2, the systematic sequence $X_k$ corresponds to the first information bit sequence $d_k$. Moreover, such bit sequence $d_k$ represents the input of the first encoder 201 which produces at its output the first parity sequence $Y_{1k}$.

On the contrary, a second information bit sequence $d_k^1$ corresponds to the first information bit sequence $d_k$ after elaboration made by an interleaver 203. Such second information bit sequence $d_k^1$ represents the input of the second encoder 202 which produces the second parity sequence $Y_{2k}$ at its output.

The interleaver 203 in the PCCC turbo code encoder 200 operates, as it is known, to interleave the information bits supplied to the same encoder 200. Such interleaving operation can be accomplished, for example, storing all input information bits consecutively in the rows of a matrix of storage locations and then reading consecutively the columns of the same matrix to access the stored bits (row-column interleaver).

It should be observed that, typically, in the PCCC encoder 200, the interleaver 203 is embedded into the encoder structure to form an overall concatenated code. In more detail, the interleaver 203 is employed to decorrelate the decoding errors produced in the first convolutional code (i.e. the first encoder 201) from those coming from the second convolutional code (i.e. the second encoder 202).

The systematic sequence of bits $X_k$, the first $Y_{1k}$ and second $Y_{2k}$ parity sequences produced by the PCCC encoder 200 are then multiplexed to form a code word. After encoding, the code word is modulated according to techniques known in the art and transmitted over the noisy communication channel 102, either wired or wireless.

Figure 3:
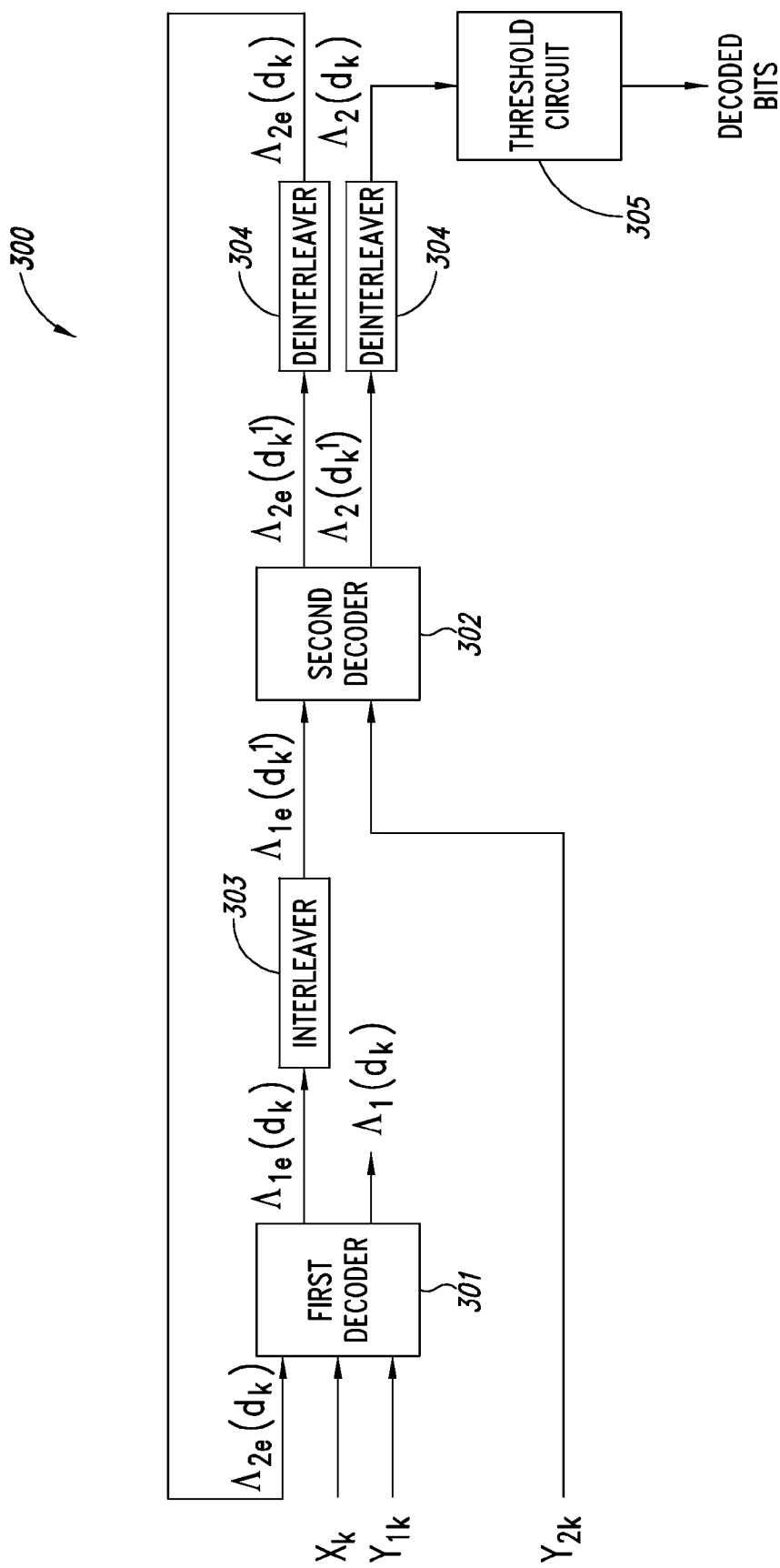
FIG. 3 schematically shows an exemplary decoder for a PCCC turbo code comprised in the communication system of FIG. 1.

FIG. 3 is a block diagram schematically showing the structure of a general PCCC turbo decoder 300 included in the receiver apparatus 103 of the communication system 100.

In more detail, such decoder 300 comprises a first 301 and a second 302 decoder for receiving and decoding the soft values $x_k$, $y_{1k}$ and $y_{2k}$ produced by the demodulator 108 of the receiver apparatus 103. Such soft values $x_k$, $y_{1k}$ and $y_{2k}$ correspond to the systematic bit $X_k$, the first parity bit $Y_{1k}$ and the second parity bit $Y_{2k}$, respectively, which have been demodulated and then filtered and sampled by, for example, a suitable filter/match/sample unit not shown in FIG. 3.

Furthermore, the PCCC turbo decoder 300 may comprise a computation unit and a memory unit both not shown in FIG. 3. For example, the computation unit may include a microprocessor (Central Processing Unit or CPU) or other kinds of processing unit and the memory unit may include one or more RAM (random access memory).

Moreover, the PCCC turbo decoder 300 can be constructed as an application specific integrated circuit (ASIC) or mapped on a field-programmable gate-array (FPGA) or a digital signal processor (DSP) software or using other suitable technologies known by one skilled in the art.

As can be seen, the soft values $x_k$ and $y_{1k}$ corresponding to the systematic bit $X_k$ and the first parity bit $Y_{1k}$, represent the inputs of the first decoder 301. The output of the first decoder 301 is a first log-likelihood ratio $\Lambda_{1e}(d_k)$ to be sent to the second decoder 302 through a first interleaver 303. Such first interleaver 303 is analogous to the interleaver 203 of the PCCC encoder 200.

Moreover, a first interleaved log-likelihood ratio $\Lambda_{1e}(d_k^1)$ represents a first input of the second decoder 302 and the soft value $y_{2k}$ corresponding to the second parity bit $Y_{2k}$ represent a second input for the same decoder 302.

Furthermore, a second interleaved log-likelihood ratio $\Lambda_{2e}(d_k^1)$ produced at the output of the second decoder 302 represents the input of a deinterleaver 304 in order to generate a deinterleaved log-likelihood ratio $\Lambda_{2e}(d_k)$ to be sent to the first decoder 301 as a feedback signal.

As known by those skilled in the art, the log-likelihood ratios $\Lambda_{1e}(d_k)$ and $\Lambda_{2e}(d_k^1)$ produced at the output of the first 301 and second 302 decoders are the so called "extrinsic information". Such extrinsic information $\Lambda_{1e}(d_k)$, $\Lambda_{2e}(d_k^1)$ each one feeding the successive decoder in an iterative fashion is used as an estimation of the "a priori probability" of the logic value (0 or 1) of information bits. The first interleaver 303 and the deinterleaver 304 reorder the extrinsic information $\Lambda_{1e}(d_k)$ and $\Lambda_{2e}(d_k^1)$, respectively, before each exchange between the first 301 and second 302 decoders.

The reliability of the estimation increases for each iterative decoding step. Finally, a hard decision on the information bits is taken at the end of the last iteration. Particularly, at the last step of iteration, a further deinterleaver 304' deinterleaves the second log-likelihood ratio $\Lambda_{2e}(d_k^1)$ produced by the second decoder 302 and the decoded bits are provided at the output of a threshold circuit 305.

According to the described example, the first 301 and second 302 modules are identical for the PCCC Turbo decoder. They can operate using different algorithms of the type Maximum A Posteriori (MAP).

An example, the first 301 and second 302 decoders implement a MAP algorithm, such as the one proposed by Bahl et al in "*Optimal Decoding Of Linear Of Linear Codes For Minimizing Symbol Error Rate*", IEEE Trans. Inform. Theory, vol. IT-20, pp. 248-287, March 1974, herein incorporated by reference.

Particularly, the first 301 and the second 302 decoders can employ the MAP algorithms in the forms "Log-MAP" and "Max-Log-MAP" algorithms, which are described in "*A Comparison of Optimal and Sub-Optimal MAP Decoding Algorithms Operating in the Log Domain*", Robertson et al., IEEE Int'l Conf. on Communications (Seattle, Wash.), June, 1995, herein incorporated by reference.

More particularly, as it will be described hereinafter, the first decoder 301 can perform at least one calculation in accordance with the "Log-MAP" algorithm.

Figure 4:
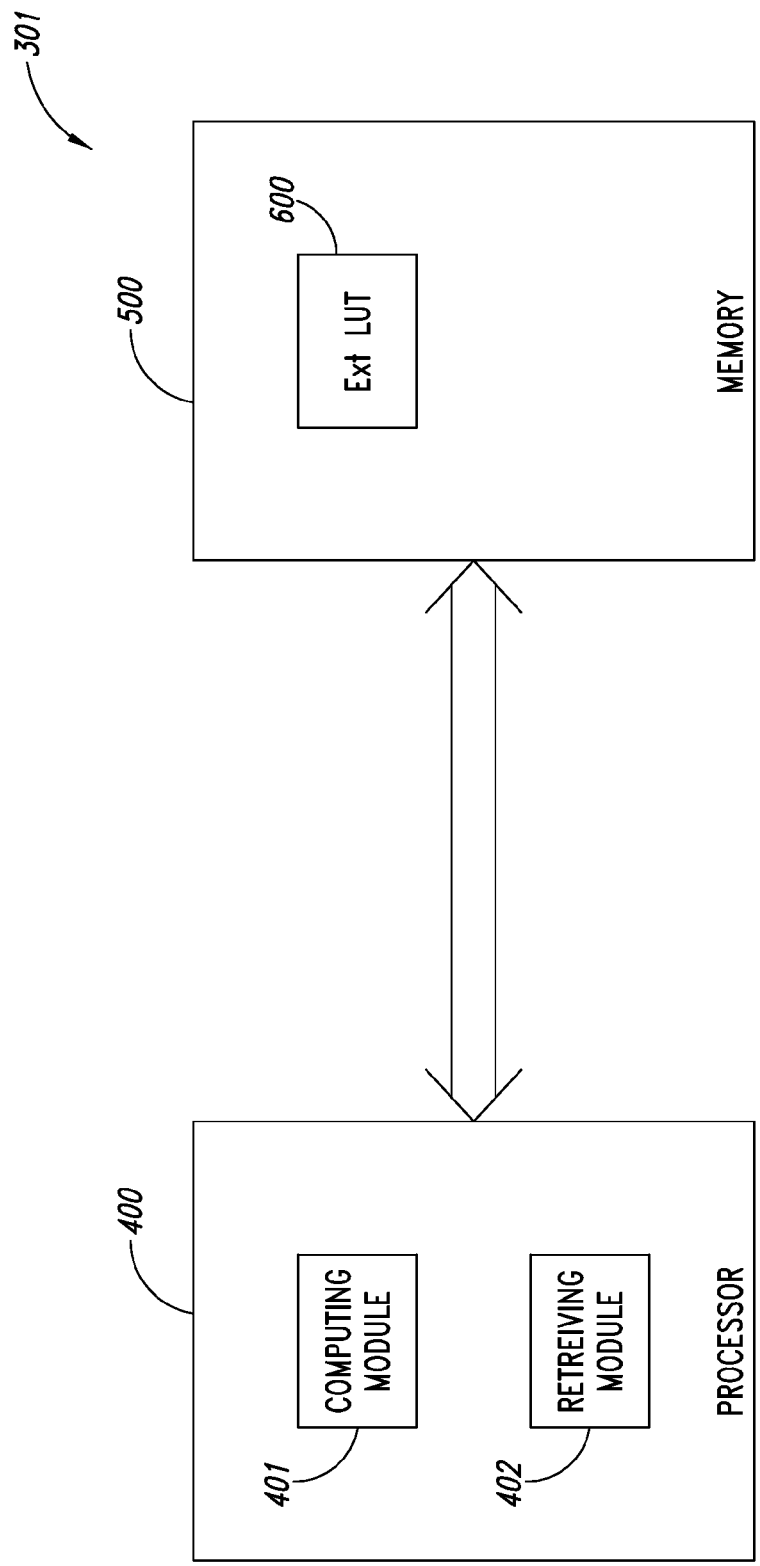
FIG. 4 schematically shows an architecture of a decoder block included in the decoder of FIG. 3.

FIG. 4 shows schematically a possible architecture to implement the first decoder 301, in accordance with an example of the invention. The first decoder 301 includes a processor module 400 and a memory module 500, which can be written and read by the processor module 400. The processor module 400 comprises a computing module 401 for performing calculations and a retrieving module 402 for retrieving data from the memory 500. The modules 400, 401, 402 and the memory 500 can be hardware and/or software modules exclusively dedicated to perform the functions of the first decoder 301, or can be included in the same hardware and/or software modules that perform all the functions of the first decoder 301.

Preferably, the modules of the architecture shown in FIG. 4 can also be so as to perform not only the functions of the first decoder 301 but also the functions of the second decoder 301 or the ones of the whole decoder 300.

Following, an example of the inventive decoding method provided by the PCCC turbo decoder 300 will be described. As already stated, such turbo decoder 300 operates, at least in part, in accordance with the Log-MAP algorithm.

Further details on the mathematical bases of the inventive method can be found in the above mentioned paper "*Near Shannon Limit Error-Correcting Coding and Decoding: Turbo-codes*", Berrou et al., Proc., IEEE Int'l Conf. On communications, Geneva, Switzerland, 1993, pp. 1064-1070.

Particularly, the first decoder 301 computes the A Posteriori Probability in logarithmic domain. The output of such decoder 301, i.e. the first log-likelihood ratio $\Lambda_1(d_k)$, can be expressed as:

$$\Lambda_1(d_k) = \log \frac{P_r(d_k = 1 / \text{observation})}{P_r(d_k = 0 / \text{observation})} \quad (1)$$

-continued $$= \log \frac{\sum_m \sum_{m'} \sum_{j=0}^{1} \gamma_1(R_k, m', m) \alpha_{k-1}^j(m') \beta_k(m)}{\sum_m \sum_{m'} \sum_{j=0}^{1} \gamma_0(R_k, m', m) \alpha_{k-1}^j(m') \beta_k(m)}$$

where m and m' are the trellis states (known to the skilled person) at time k and k−1, respectively. Moreover, values $\alpha$, $\beta$ are usually called forward, and backward metrics and $\gamma$ is usually called branch transition probability. These three quantities are kind of probabilities computed on the basis of the following equations:

$$\alpha_k^j(m) = h_\alpha \sum_{m'} \sum_{j=0}^{1} \gamma_i(R_k, m', m) \alpha_{k-1}^j(m') \quad (2)$$

$$\beta_k(m) = h_\beta \sum_{m'} \sum_{i=0}^{1} \gamma_i(R_{k+1}, m, m') \beta_{k+1}(m') \quad (3)$$

$$\gamma_i(R_k, m', m) = p(R_k / d_k = i, S_k = m, S_{k-1} = m') \quad (4)$$
$$q(d_k = i / S_k = m, S_{k-1} = m') \pi(S_k = m / S_{k-1} = m')$$

where $h_\alpha$ and $h_\beta$ are normalization constants.

Moreover, $R_k$ corresponds to the soft values $x_k$, $y_{1k}$ at the output of the noisy channel 102 after demodulation. With p( ) is indicated the transition probability of a discrete gaussian memoryless channel. Then, q( ) is the function that select the possible transition in a convolutional encoder finite state machine and $\pi$( ) is the transition state probability.

As known by those skilled in the art, the values $\alpha$ and $\beta$ can be recursively calculated from $\gamma$ during the trellis forward and backward recursions, respectively.

If we apply the logarithm operator to the branch transition probability $\gamma$, we obtain a further branch transition probability $\hat{\gamma}$ expressed as:

$$\hat{\gamma}(R_k, m', m) = \log \gamma(_i(R_k, m', m)) = \log [p(R_k/d_k=i, S_k=m, S_{k-1}=m')_q(d_k=i/S_k=m, S_{k-1}=m')] + \log(\pi(S_k=m/S_{k-1}=m')) \quad (5)$$

then, the forward $\alpha$ and backward $\beta$ metrics can be expressed as further forward $\hat{\alpha}$ and backward $\hat{\beta}$ metrics:

$$\hat{\alpha}_k^j(m) = \log \left( h_\alpha \sum_{m'} \sum_{j=0}^{1} \exp(\hat{\gamma}_i(R_k, m', m)) \exp(\hat{\alpha}_{k-1}^j(m')) \right) \quad (6)$$

$$= \log \left( \sum_{m'} \sum_{j=0}^{1} \exp(\hat{\gamma}_i(R_k, m', m) + \hat{\alpha}_{k-1}^j(m')) \right) + H_\alpha$$

$$\hat{\beta}_k(m) = \log \left( \sum_{m'} \sum_{i=0}^{1} \exp(\hat{\gamma}_i(R_{k+1}, m, m') + \beta_{k+1}(m')) \right) + H_\beta \quad (7)$$

where the terms $H_\alpha$ and $H_\beta$ correspond to the above indicated normalization constants $h_\alpha$ and $h_\beta$ and the first log-likelihood ratio $\Lambda_1(d_k)$, can be expressed as:

$$\Lambda_1(d_k) = \log \frac{P_r(d_k = 1 / \text{observation})}{P_r(d_k = 0 / \text{observation})} = \quad (8)$$

-continued $$
\begin{aligned}
&= \log \frac{\sum_m \sum_{m'} \sum_{j=0}^{1} \exp\left(\begin{array}{l}\hat{\gamma}_1(R_k, m', m) + \\ \hat{\alpha}_{k-1}^j(m') + \hat{\beta}_k(m)\end{array}\right)}{\sum_m \sum_{m'} \sum_{j=0}^{1} \exp\left(\begin{array}{l}\hat{\gamma}_0(R_k, m', m) + \\ \hat{\alpha}_{k-1}^j(m') + \hat{\beta}_k(m)\end{array}\right)} \\
&= \log\left(\sum_m \sum_{m'} \sum_{j=0}^{1} \exp\left(\begin{array}{l}\hat{\gamma}_1(R_k, m', m) + \\ \hat{\alpha}_{k-1}^j(m') + \hat{\beta}_k(m)\end{array}\right)\right) - \\
&\quad \log\left(\sum_m \sum_{m'} \sum_{j=0}^{1} \exp\left(\begin{array}{l}\hat{\gamma}_0(R_k, m', m) + \\ \hat{\alpha}_{k-1}^j(m') + \hat{\beta}_k(m)\end{array}\right)\right) \\
&= \Lambda\_1 - \Lambda\_2
\end{aligned}
$$

It should be observed that the quantities in (6), (7) and (8) can be computed by solving recursively terms such as the following:

$$\log(\exp(\alpha_1+\alpha_2))=\max(\alpha_1,\alpha_2)+\log(1+e^{-|\alpha_1-\alpha_2|})=\max{}^*(\alpha_1,\alpha_2) \quad (9)$$

where the operator max*$(a_1,a_2)$ comprises a max operator between general quantities $a_1$ and $a_2$ and a correcting factor $\log(1+e^{-|\alpha_1-\alpha_2|})$ that is function (in particular, a transcendent function) of the modulus of the difference between the same quantities.

As an example, the recursion to compute the metrics $\hat{\alpha}$ will be performed by a recursive application of Eq (9) where the arguments will be terms like:

$$\hat{\gamma}_i(R_k,m',m)+\hat{\alpha}_{k-1}^j(m').$$

Instead, the computation of $\Lambda$ will be performed by a two recursive application of Eq (9) (one for each term of the subtraction of expression (8)) where the arguments will be terms like:

$$(\hat{\gamma}_1(R_k,m',m)+\hat{\alpha}_{k-1}^j(m')+\hat{\beta}_k(m)).$$

Advantageously, to approximate the correcting factor $\log(1+e^{-|\alpha_1-\alpha_2|})$ a Look-Up Table or LUT is adopted.

Such LUT could be memorized in the memory 500 provided in the decoder 300 and, for example, it can be generated by a processor external to the turbo decoder 300 and downloaded into the decoder itself during data processing of the input data. Alternatively, the LUT can be generated within the turbo decoder 300.

It should be observed that the number of elements of the LUT depends on the metric representation precision.

Accordingly, we assume that the branch transition probabilities $\hat{\gamma}$ are digitized according to the formula:

$$\hat{\gamma}_q = \text{round}(\hat{\gamma}2^p) \quad (10)$$

where p is the number of bits dedicated to the precision or equivalently $2^{-p}$ is the quantization interval.

Then, assuming that a saturation is applied and considering that a limited number of bits is available in any real implementation:

$$\text{if } \begin{cases} \hat{\gamma}_q \geq 2^{(p+d-1)} \Rightarrow \hat{\gamma}_q = 2^{(p+d-1)} - 1 \\ \hat{\gamma}_q \leq -2^{(p+d-1)} \Rightarrow \hat{\gamma}_q = -2^{(p+d-1)} \end{cases} \quad (11)$$

where d is the number of bits dedicated to the signal dynamic and p+d is equal to the number of ADC bits as known by those skilled in the art.

Consequently, each element in the LUT can be defined as:

$$\text{LUT}(\Delta) = \text{round}(\log(1+\exp(-\Delta/2^p))2^p) \quad (12)$$

where $\Delta=|\hat{\gamma}_{q1}-\hat{\gamma}_{q2}|$ and the round operator represents the nearest integer. Each value LUT($\Delta$) represents the correcting factor of the max*$(a_1,a_2)$ operator expressed by the formula (9).

Generally, the LUT has a limited number of elements given by the maximum integer $\Delta_{max}$ that satisfies the following inequality:

$$\log(1+\exp(-\Delta_{max}/2^p)) \geq 2^{-(p+1)} \quad (13)$$

For example, the LUT obtainable the levels of precision p=1 is shown in

TABLE 1

| | P = 1 | | | | |
|---|---|---|---|---|---|
| LUT ($\Delta$) | 1 | 1 | 1 | 1 | 1 |
| $\Delta$ | 0 | 1 | 2 | 3 | 4 |

The argument $\Delta$ of the LUT can varies within a limited range having $\Delta_{max}=4$ as maximum limit. Each tabled value is associated to a corresponding value of the argument $\Delta$.

The following Table 2 shows the tabled values of the LUTs for the level of precision p=2 and p=3. The values of the argument $\Delta$ are not shown in Table 2 for seek of clarity.

TABLE 2

| P | LUT |
|---|---|
| 2 | 3; 2; 2; 2; 1; 1; 1; 1 |
| 3 | 6; 5; 5; 4; 4; 3; 3; 3; 2; 2; 2; 2; 1; 1; 1; 1; 1; 1; 1 |

Neglecting the correcting factor $\log(1+e^{-|\alpha_1-\alpha_2|})$ in (9) the Log-MAP algorithm becomes the well-known Max-Log-MAP algorithm. Particularly, such Max-Log-MAP algorithm presents a loss of performances compared to the Log-MAP because the Max-Log-MAP requires an increase of 0.3-0.4 dB of signal-to-noise ratio to achieve the same BER given by Log-MAP. Equation (12) and the corresponding LUTs, of the examples of Table 1 and Table 2, represent a standard approach to implement and use a look-up table.

In the description below the LUT corresponding to the equation (12) will be called standard LUT, "Std LUT".

Figure 5:
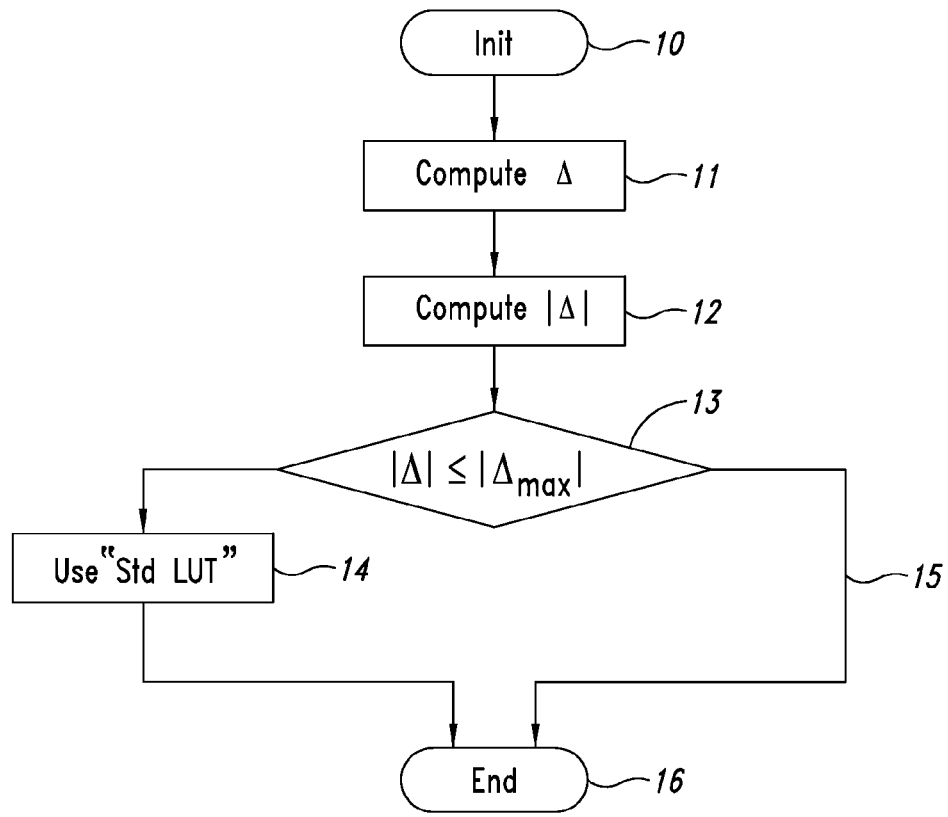
FIG. 5 shows a flow diagram of the operations related to the use of a Look-Up_Table in accordance with a standard approach.

Moreover, a method of using the Std LUT will be now described with reference to FIG. 5 and will be named Standard Approach. The steps for taking into account the correcting factor through the Std LUT of equation (12) are listed below:

Step 10: initial step "Init";
Step 11: computing $\Delta=(\hat{\gamma}_1-\hat{\gamma}_2)$;
Step 12: computing $|\Delta|$;
Step 13: performing the conditional procedure:
if $\Delta \leq \Delta_{max}$ (step block 13 of FIG. 5)
applying max*$(\hat{\gamma}_1,\hat{\gamma}_2)=\max(\hat{\gamma}_1,\hat{\gamma}_2)+\text{LUT}(\Delta)$, (evaluating LUT ($\Delta$) by retrieving tabled values from the standard LUT Std LUT, step block 14);
else
evaluating max*$(\hat{\gamma}_1,\hat{\gamma}_2)=\max(\hat{\gamma}_1,\hat{\gamma}_2)$, without using the standard LUT Std LUT, (transition 15);
Step 16: end of the method.

It has to be noticed that the standard look-up tables Std LUTs have size reduced at minimum, but the standard approach requires the computation of the modulus and a check on its value. These operations that have to be performed in a recursive manner require great computational power.

In view of the above, a look-up table alternative to the standard one STd LUT and a method of using the table alternative to the standard approach, are proposed, in accordance with one embodiment of the invention. Particularly, in the memory 500 is memorized a look-up table "Ext LUT" 600 still derivable from equation (12) but different from the Sdt LUT discussed above.

In detail, such Ext LUT 600 is such that:
the number of tabled values, N, is equal to twice than the maximum expected metric difference $\Delta_M$ plus one : $N=2\Delta_M+1$;
the LUT is filled with values equal to zeros (that is to say, null values) except in the positions;
$i=\Delta_M+1+k$ with $k=0:\Delta_{max}$ where Ext LUT(i)=Std LUT(k+1);
$i=\Delta_M-k$ with $k=1:\Delta_{max}$ where Ext LUT(i)=Std LUT(k); and
the maximum expected metric difference $\Delta_M$ can be estimated on the basis of the particular turbo code employed.

In other words, the look-up table Ext LUT 600 includes:
the same not null values of the standard look-up table Std LUT for arguments i (i.e. indexes) included in the range $\Delta_M+1:\Delta_M+1+\Delta_{max}$; in this range the values are ordered from left to right according to the same order of the look-up table Std LUT;
a second group of values constituted by the same values of the first group but ordered in an opposite way (i.e. according a "mirror-like order") for arguments i included in the range $\Delta_M-\Delta_{max}:\Delta_M+1$; in accordance with said "mirror-like order" the values of the second group correspond to the ones of look-up table Std LUT but they are ordered from right to left;
the center value of the array of the Ext LUT 600 corresponds to the first value of the Standard LUT and is indicated only once in the LUT; in other words for the center value the mirror-like order is not applied to; and
a third group constituted by null values for arguments i external to the above ranges.

Therefore, the Ext LUT shows an "extended size" in comparison with standard LUT, Std LUT.

Table 4 shows three examples of extended look-up tables Ext LUT 600, for different precisions p.

TABLE 4

| p | |
|---|---|
| 1 | 0; . . . 0; 1; 1; 1; 1; 1; 1; 1; 1; 0; . . . 0; |
| 2 | 0; . . . 0; 1; 1; 1; 1; 2; 2; 2; 3; 2; 2; 2; 1; 1; 1; 1; 0; . . . 0; |
| 3 | 0; . . . 0; 1; 1; 1; 1; 1; 1; 1; 2; 2; 2; 2; 3; 3; 3; 3; 4; 4; 5; 5; 6; 5; 5; 4; 4; 3; 3; 3; 2; 2; 2; 2; 1; 1; 1; 1; 1; 1; 1; 0; . . . 0; |

Each of the tabled values is associated to the index i above defined.

The max*( ) algorithm implemented by the first decoder 301 is:

$$\max*(\hat{\gamma}_1,\hat{\gamma}_2)=\max(\hat{\gamma}_1,\hat{\gamma}_2)+LUT(\Delta_M+1+\hat{\gamma}_1-\hat{\gamma}_2) \quad (14)$$

Figure 6:
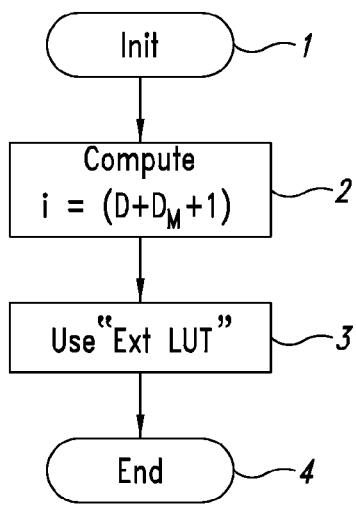
FIG. 6 shows a flow diagram of the operations related to the use of another Look-Up_Table in accordance with a preferred embodiment of the invention.

In accordance with an example of the invention, the processor module 400 of the first decoder 301 uses the look-up table Ext LUT 600 as schematically shown in FIG. 6:

Step 1: start "Init";

Step 2: the first computing module 401 computes the current index i by summing said first argument, said maximum limit and the value one:

$$i=\Delta+\Delta_M+1;$$

Step 3: on the basis of the computed index i the retrieving module 403 reads the look-up table Ext LUT 600 from the memory 500, and retrieves a corresponding tabled value;

Step 4: end of the procedure.

Therefore, by means of the Step 3, the processor module 400 obtains the corrective factor of equation (14) that can be zero or different from zero. It has to be observed that the procedure described with reference to FIG. 6 does not require any conditional expression such as the expression 13 of FIG. 5. Moreover, the quantity $\Delta$ may assume negative values, but the argument i (which is the index for accessing to the Ext LUT) will assume positive values.

According to the example described, the computing module 401 computes the transition probabilities $\hat{\gamma}$ and computes the Forward $\hat{\alpha}$, the Backward $\hat{\beta}$ metrics and the Log-Likelihoods Ratio $\Delta_1(d_k)$ in accordance with the equations (6), (7) and (8).

Figure 7:
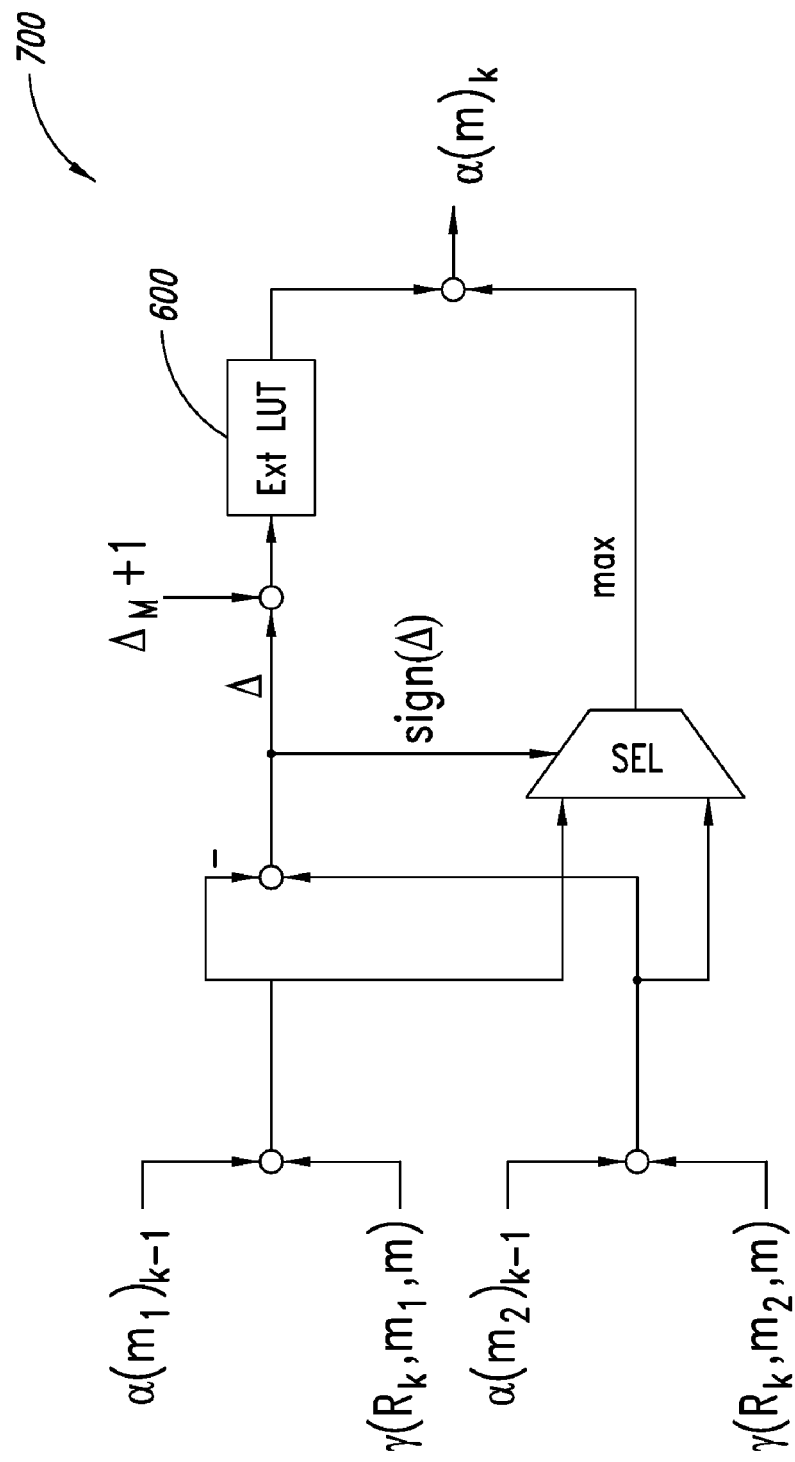
FIG. 7 shows an architecture illustrating the operations implemented to compute a value of the forward metric.

As an example, FIG. 7 shows an architecture 700 illustrating the operations implemented to compute a value of the Forward metric $\hat{\alpha}$, in accordance with equation (6), the max*( ) algorithm and by employing the Ext LUT 600.

In FIG. 7 adding and subtracting nodes are shown, which are necessary for the computing of the quantity $\Delta$. Moreover, the architecture 700 includes a selector SEL for evaluating the term max of the max*( ) algorithm.

Another branch of the architecture 700 shows the operations performed to compute the index i and the use of the Ext LUT 600 in such a way to obtain the correcting factor of the max algorithm. The correcting factor is then added, by means of a corresponding node, to the max term. The backward metrics $\hat{\beta}$ are computed in an analogous way.

Figure 8:
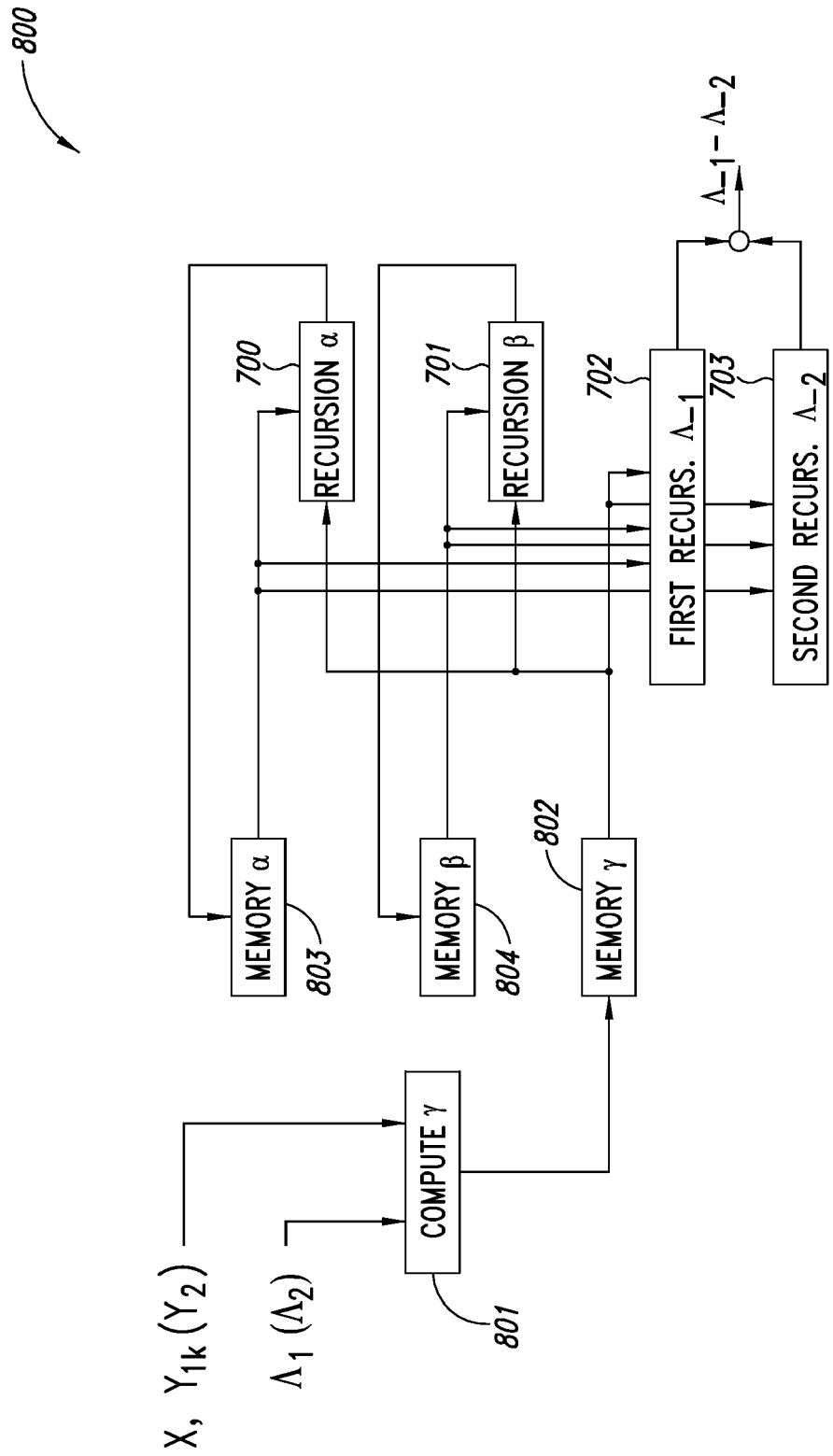
FIG. 8 shows an architecture illustrating the operations performed by a first decoder for computing the log-likelihoods ratio.

Moreover, FIG. 8 shows an architecture 800 illustrating the operations performed by the first decoder 301 for computing the Log-Likelihoods Ratio $\Delta_1(d_k)$.

On the basis of the systematic bit X and the first parity bit $Y_1$ and on the basis of a value of a Log-Likelihoods Ratio $\Lambda_1$, evaluated in a previous recursion step, a computing module 801 gives the transition probabilities $\hat{\gamma}$ which is stored in a corresponding first memory module 802.

The architecture 800 includes recursion modules 700, 701, 702 and 703 for computing, respectively, the Forward metrics $\hat{\alpha}$, the Backward metrics $\hat{\beta}$ and the first and second terms $\Lambda\_1-\Lambda\_2$ of the expression (8).

The recursion module 700 has been already described with reference to FIG. 7, and each of the other recursion modules 701, 702 and 703 are analogous to the module 700 and, therefore, they are not described in detail. During the recursive processing, the values of the Forward metrics $\hat{\alpha}$ and Backward metrics $\hat{\beta}$ are stored in respective memory modules 803 and 804.

With reference to the evaluation of the quantities of the equations (6), (7) and (8), in accordance with an example of the invention the architectures 700 and 800 can be configured so as to evaluate all these three quantities by applying for each of them the Log-MAP algorithm using the look-up table Ext LUT 600.

According to an alternative embodiment, the Log-MAP algorithm can be applied to only one or two of the above quantity, while the remaining one is computed by means of the Max-Log-Map algorithm. The applicant has made a profiling test with a proprietary VLIW (very long instruction word) digital signal processor. In this test the complexity of the decoding process using a look-up table in accordance with the invention (Ext LUT) is compared with the complexity of the decoding process using the standard look-up table and the decoding process using the Max-Log MAP algorithm.

Table 5 shows the results of the test reporting the complexity increase with respect to Max-Log-MAP algorithm. The test reports the case of PCCC with 8 decoding iterations and the complexity is measured in terms of clock cycles required by the decoding processes.

|  | Performance @ BER = 10$^{-5}$ | Complexity Std LUT | Complexity Ext LUT |
| --- | --- | --- | --- |
| Max-Log-MAP | REF | 100% | |
| Log-MAP | ≈+0.4 dB | ≈510% | ≈210% |

The adoption of Ext LUT reduces the amount of clock cycles more than 50% compared to the Std LUT case. The implementation of Log-MAP algorithm in software, using the Std LUT, costs 5 times more than Max-Log-MAP in term of complexity; the cost becomes approximately two time with same performances at the expense of a certain amount of extra memory. However, in practical cases, Ext LUT size is not very large and the advantage in term of complexity/speed is often a good reason to accept the extra amount of memory.

The gain, obtained using Ext LUT, is due to the fact that a software implementation becomes extremely inefficient when operations are "interrupted" by conditional expression. Specifically, for VLIW machines, like the one used for the complexity estimation presented in, the pipeline must be discharged due to a branch operation: this fact justifies the large difference between the two cases.

No performance loss is paid with the adoption of Ext LUT because Std and Ext LUTs are perfectly equivalent in terms of signal processing.

Also in hardware implementation the present invention allows a complexity reduction in the management of max* operator. As shown in FIG. 5 and FIG. 6, it is clear the algorithm simplification in the LUT usage.

Even if the above description refers to the case in which the teachings of the invention are implemented only by the first decoder 301, it has to be pointed out that such teachings can be applied alternatively or, preferably, in addition also to the second decoder 302. Advantageously, the second decoder 302 is so as to compute quantities analogous to the above described probabilities α, β and computes the likelihood-ratio $\Lambda_2$ in accordance with the method above described with reference to the first decoder 301. To this end, a further look-up table, analogous to the table 600, can be stored in the decoder 300 and employed by the second decoder 302 or alternatively, the second decoder can employ the same look-up table 600 of the first decoder 301. The processing performed by the second decoder 302 is analogous to the one described with reference to the architectures 700 and 800 shown in FIGS. 7 and 8. Particularly, with reference to FIG. 7, the second decoder 302 receives the second parity sequence $Y_2$ and the log-likelihood ratio $\Lambda_2$ evaluated at a previous step.

Moreover, it has to be noticed that the teachings of the present invention can be applied also to codes different from the turbo code. An example of another code, for which the extended look-up table (including values equal to zero) can be used, is described in the paper of Hagenauer J.; Offer E.; Papke L.: "*Iterative Decoding of Binary Block and Convolutional Codes*" IEEE Trans. Inform. Theory, March 1996, pp. 429-445, herein incorporated by reference.

In accordance with the authors of the above paper, the Log-Likelihoods Ratio LLR of the sum of two binary variables a,b with LLR La, Lb is given by:

$$L_{(a \oplus b)} = \log\left(\frac{1 + e^{L_a + L_b}}{e^{L_a} + e^{L_b}}\right) \quad (15)$$

The LLR of the sum of more than two binary variables is given by the recursive application of the equation (15). This formula can be exploited to decode every linear binary block code. It is worth to note that:

$$L_{(a \oplus b)} = \log\left(\frac{1 + e^{L_a + L_b}}{e^{L_a} + e^{L_b}}\right) = \max{}^*(0, L_a + L_b) - \max{}^*(L_a, L_b) \quad (16)$$

Another code to which the present invention can be applied is the Low-Density Parity Check Codes (LDPCC) proposed by Gallager R. G. in "Low-Density Parity-Check Codes", IRE Trans. Information Theory, pop. 22-28, January 1962. The LDPCCs are an important class of codes decodable through the application of the above formulas (16). An interesting application of the above formulas to the decoding of LDPCC can be found in the paper of X. Hu, E. Eleftheriou, D.-M. Arnold and A. Dholakia. "Efficient Implementations of the Sum-Product Algorithm for Decoding LDPC Codes". In Proc. IEEE Globecom, 2001.

As clear from the above, the present invention shows important advantages:
  reduces complexity to implement max* operation for Turbo decoding and for MAP decoding of linear binary block codes;
  valid solutions for both software and hardware implementation;
  no drawback in terms of performances;
  the cost to be paid is a small amount of extra-memory.

Obviously, to the decoding method of the present invention, those skilled in the art, aiming at satisfying contingent and specific requirements, may carry out further modifications and variations, all however being contemplated within the scope of protection of the invention, such as defined in the annexed claims.

We claim:

1. A method for performing iterative decoding of information coded by an error correction code, the method comprising:
  defining a transcendent first function representing a quantity to be evaluated for the decoding method;
  defining a quantized second function approximating the first function;
  computing first values of the second function obtained based on first arguments; the first values being not null and the first arguments being variable in a limited range having a maximum limit;
  computing second values of the second function obtained based on second arguments, the second values being null and the second arguments being external to the range;
  generating a look-up table representing the first function and containing the first and second values associated with indexes correlated to said first arguments and to an expected maximum limit;
  retrieving tabled values from said look-up table based on corresponding indexes for computing said quantity;

receiving first and second soft values produced by a turbo encoder representing information transmitted on a communication channel, the first soft value corresponding to a transmitted bit to be decoded;

computing the log-likelihood ratio by an iterative processing in a first decoder based on the forward and backward metrics and on the first and a second soft values; and feeding an interleaver with the calculated log-likelihood ratio to obtain an interleaved log-likelihood ratio.

2. The method according to claim 1, wherein retrieving the values includes:
computing a current index by processing one of the first arguments and the maximum expected limit,
using the look-up table to determine a tabled value.

3. The method according to claim 2, wherein said current index is variable within a second range equal to twice than the maximum expected limit plus one, said look-up table including:
a first group of values constituted by said first values;
a second group of values constituted by the first values ordered in a mirror-like order to the first group;
a third group of values constituted by said second values.

4. The method according to claim 3, wherein computing the current index includes:
summing said first argument, said maximum expected limit and the value one.

5. The method according to claim 1, wherein said method includes computing a log-likelihoods ratio by means of said look-up table.

6. The method according claim 1, wherein said decoding is performed in accordance with a Log-MAP algorithm.

7. The method according to claim 1, wherein said look-up table is used to computing a correcting factor of a log-MAP algorithm.

8. The method according to claim 7, wherein the decoding includes performing a decoding of a turbo code and the tabled values represent correction factors used to compute metrics.

9. The method according to claim 8, further comprising:
performing a first calculation to obtain forward metrics;
performing a second calculation to obtain backward metrics; and
performing a third calculation to obtain a log-likelihood ratio for every information bit to be decoded.

10. The method according to claim 9, wherein each of said first, second and third calculations includes using said look-up table in accordance with a corresponding Log-MAP decoding algorithm.

11. The method according to claim 9, wherein at least one and no more than two of said calculations are performed by the use of said look-up table for implementing the Log-MAP decoding algorithm and the remaining calculations are performed implementing a Max Log-MAP decoding algorithm.

12. The method according to claim 8, wherein implementing the Log-MAP decoding algorithm further includes estimating functions max*$(a_1,a_2)$ where $a_1$ and $a_2$ are parameters correlated to the one of the following quantities: forward and backward metrics and likelihood ratio.

13. The method according to claim 1, wherein said second function corresponds to a further look-up table LUT($\Delta$) which has substantially the following formula:

$$LUT(\Delta)=round(log(1+exp(-\Delta/2^p))2^p)$$

where p is a factor corresponding to a number of bits dedicated to the precision of the value LUT($\Delta$) and $\Delta$ is indicative of the first arguments varying within said range having maximum limit $\Delta_{max}$.

14. The method according to claim 13, wherein said current index is variable within a second range equal to twice than the maximum expected limit plus one, said look-up table including:
a first group of values constituted by said first values;
a second group of values constituted by the first values ordered in a mirror-like order to the first group;
a third group of values constituted by said second values, wherein the first group of tabled values of said look-up table are equal to the values of said further look-up table.

15. The method according to claim 1, further comprising:
receiving a third soft value produced by the turbo encoder representing further information transmitted on the communication channel;
feeding a second decoder with said interleaved log-likelihood ratio and said third soft value to generate an output first quantity and a second quantity;
feeding a first deinterleaver with the second quantity obtaining a feedback quantity;
supplying said feedback quantity to the first decoder;
supplying to a second interleaver the first quantity to generate an interleaved quantity; and
starting from said interleaved quantity generating a decoded bit corresponding to the transmitted bit.

16. An apparatus, comprising:
a first decoder for performing iterative decoding of information coded by an error correction code, the first decoder including:
a memory storing a look-up table comprising a plurality of tabled values associated with corresponding indexes, said plurality of tabled values comprising:
a first set of non-null values associated with a first set of arguments included in a limited range; and
a second set of null values associated with a second set of arguments external to said limited range; and
a processor module for retrieving said tabled values from the look-up table based on said indexes and evaluating a quantity related to a decoding function.

17. The apparatus according to claim 16, wherein the processor module comprises:
a first computing module for computing a current index by processing a current first argument and a maximum limit; and
a retrieving module for reading the look-up table to determine a tabled value.

18. The apparatus according to claim 17, wherein said processing module is configured to compute a log-likelihoods ratio by means of said look-up table.

19. The apparatus according to claim 17, wherein said processing module is configured in accordance with a Log-MAP algorithm.

20. The apparatus according to claim 17, wherein said processing module is configured to read the look-up table for computing a correcting factor of a log-MAP algorithm.

21. The apparatus according to claim 17, wherein performs a decoding of a turbo code and the tabled values represent a correcting factor of a max*$(a_1,a_2)$ function.

22. The apparatus according to claim 17, wherein said first decoder further includes a second computing module configured for:
performing a first calculation to obtain forward metric;
performing a second calculation to obtain backward metrics; and
performing a third calculation to obtain a log-likelihood ratio for every information bit to be decoded.

23. The apparatus according to claim 22, said first decoder further comprising an input for receiving first and second soft values produced by a turbo encoder representing information transmitted on a communication channel, the first soft value corresponding a transmitted bit to be decoded; the processing module being configured to compute the log-likelihood ratio by an iterative processing based on forward and backward metrics and on said first and a second soft values.

24. The apparatus according to claim 23, further comprising an interleaver for elaborating the calculated log-likelihood ratio to obtain an interleaved log-likelihood ratio.

25. The apparatus according to claim 24, wherein said input receives a third soft value produced by a turbo encoder representing further information transmitted on the communication channel.

26. The apparatus according to claim 25, further comprising:
  a second decoder for elaborating said interleaved log-likelihood ratio and said third soft value to generate a first output quantity and a second quantity; and
  a first deinterleaver of the second quantity for obtaining a feedback quantity; said feedback quantity being supplied to said first decoder.

27. The apparatus according to claim 26, further comprising:
  a second interleaver fed with the first output quantity and generate an interleaved quantity; and
  a decision module for generating a decoded bit corresponding to the transmitted bit, starting from said interleaved quantity.

28. The apparatus according to claim 16, wherein said indexes are variable within a second range equal to twice the maximum limit plus one.

29. The apparatus according to claim 28, wherein the computing module is configured for computing the current index value by summing said argument, said maximum limit and the value one.

* * * * *